United States Patent
Sampsell et al.

(10) Patent No.: US 12,150,338 B2
(45) Date of Patent: Nov. 19, 2024

(54) OLED DISPLAY SCREEN INCLUDING A LIGHT ABSORPTION LAYER, AND APPARATUS INCLUDING SUCH AN OLED DISPLAY SCREEN

(71) Applicant: AMS INTERNATIONAL AG, Jona (CH)

(72) Inventors: Matthew Sampsell, Rapperswil (CH);
Greg Stoltz, Rapperswil (CH);
Kathryn Pulejo, Rapperswil (CH)

(73) Assignee: AMS INTERNATIONAL AG, Jona (CH)

( * ) Notice: Subject to any disclaimer, the term of this patent is extended or adjusted under 35 U.S.C. 154(b) by 335 days.

(21) Appl. No.: 17/607,858

(22) PCT Filed: Apr. 22, 2020

(86) PCT No.: PCT/EP2020/061169
§ 371 (c)(1),
(2) Date: Oct. 29, 2021

(87) PCT Pub. No.: WO2020/221633
PCT Pub. Date: Nov. 5, 2020

(65) Prior Publication Data
US 2022/0190301 A1 Jun. 16, 2022

Related U.S. Application Data

(60) Provisional application No. 62/840,796, filed on Apr. 30, 2019.

(51) Int. Cl.
*H10K 50/86* (2023.01)
*H10K 50/856* (2023.01)
*H10K 59/60* (2023.01)

(52) U.S. Cl.
CPC ......... *H10K 50/865* (2023.02); *H10K 50/856* (2023.02); *H10K 59/60* (2023.02)

(58) Field of Classification Search
None
See application file for complete search history.

(56) References Cited

U.S. PATENT DOCUMENTS

| | | | |
|---|---|---|---|
| 2013/0050148 A1* | 2/2013 | Jeon | G06F 3/0386 345/175 |
| 2017/0186891 A1 | 6/2017 | Min | |

(Continued)

FOREIGN PATENT DOCUMENTS

| | | |
|---|---|---|
| CN | 107275376 A | 10/2017 |
| CN | 108363520 A | 8/2018 |

(Continued)

OTHER PUBLICATIONS

TW Office Action for corresponding TW Application No. 109114397, dated Feb. 15, 2024, 11 pgs.

(Continued)

*Primary Examiner* — Nduka E Ojeh
(74) *Attorney, Agent, or Firm* — Tarolli, Sundheim, Covell & Tummino LLP

(57) ABSTRACT

A display screen (12A) includes a carrier (18), OLED pixels (14) disposed over the carrier (18), and control circuitry (16) disposed over the carrier (18) and coupled to the OLED pixels (14). The display screen (12A) also includes a light absorption layer (100) disposed in a plane such that the carrier (18) is on a first side of the plane, and the OLED pixels (14) and control circuitry (16) are on a second side of the plane. In some implementations, the light absorption layer (100) helps prevent light (40) emitted by an optical sensor module (10) disposed behind the OLED display screen (12A) from directly impinging on light sensitive regions of the display screeds control circuitry (16). The (Continued)

light absorption layer (100) also can, in some instances, help prevent light (42) from directly impinging on, and being reflected by, regions of the display screeds pixels (14).

18 Claims, 8 Drawing Sheets

(56) References Cited

U.S. PATENT DOCUMENTS

| | | |
|---|---|---|
| 2018/0005006 A1* | 1/2018 | Chai .................. G06V 40/1318 |
| 2018/0211088 A1 | 7/2018 | Cho |
| 2018/0357460 A1 | 12/2018 | Smith et al. |
| 2019/0057657 A1 | 2/2019 | Liu et al. |
| 2020/0076999 A1* | 3/2020 | Akiyama .......... H01L 27/14647 |
| 2020/0212135 A1* | 7/2020 | Zhang .................... H10K 59/40 |
| 2020/0335524 A1* | 10/2020 | Lee ....................... H01L 23/552 |
| 2021/0151524 A1* | 5/2021 | Tang .................. G06V 40/1318 |
| 2022/0149024 A1* | 5/2022 | Jia .......................... H10K 59/70 |

FOREIGN PATENT DOCUMENTS

| | | |
|---|---|---|
| CN | 108364978 A | 8/2018 |
| EP | 3355399 A2 | 8/2018 |
| KR | 20160027280 A | 3/2016 |

OTHER PUBLICATIONS

AMS International AG, "OLED Display Screen Including a Light Absorption Layer, and Apparatus Including Such an OLED Display Screen", First Chinese Office Action, dated Jun. 28, 2023, CN application No. 202080032379.8, Filed Apr. 30, 2019, pp. 1-8.

International Search Report and Written Opinion for corresponding patent application No. PCT/EP2020/061169 dated Jul. 14, 2020.

\* cited by examiner

OLED DISPLAY SCREEN INCLUDING A LIGHT ABSORPTION LAYER, AND APPARATUS INCLUDING SUCH AN OLED DISPLAY SCREEN

RELATED APPLICATIONS

The present invention is a U.S. National Stage under 35 USC 371 patent application, claiming priority to Serial No. PCT/EP2020/061169, filed on 22 Apr. 2020; which claims priority of U.S. Patent Application No. 62/840,796, filed on 30 Apr. 2019, the entirety of both of which are incorporated herein by reference.

FIELD OF THE DISCLOSURE

The present disclosure relates to organic light emitting diode (OLED) display screens and systems that optimize the OLED display for use with one or more sensor modules.

BACKGROUND

A recent trend in smartphone industrial design is to maximize the screen area by reducing the bezel width and decluttering the remaining bezel area by removing apertures for optical sensors and other holes for microphones, speakers and/or fingerprint reading devices. On the other hand, there also is a trend to increase the number of optical sensor modules for added functionality. Thus, various types of optical sensor modules, such as optical proximity sensor modules, ambient light sensor modules, ranging sensor modules such as time-of-flight (TOF) sensor modules, 2D imaging sensor modules, and 3D imaging sensor modules such as structured light sensor modules, can be integrated into smartphones and other portable computing devices. Many of these sensor modules include both light emitters and sensors to perform their functions.

A further trend in the smartphone market is the adoption of organic light emitting diode (OLED) displays. This trend creates an opportunity to move the sensor modules from the smartphone's bezel to a position under or behind the OLED display.

SUMMARY

The present disclosure describes OLED display screen that include a light absorption layer. In some implementations, the light absorption layer can help prevent light emitted, for example, by an optical sensor module disposed behind the OLED display screen from directly impinging on light sensitive regions of the display screen's control circuitry. The light absorption layer also can help prevent light from directly impinging on, and being reflected by, regions of the display screen's pixels. The addition of the light absorption layer thus can be advantageous, in some instances, by allowing the light source in the sensor module to be operated at a higher power and/or for a longer duration without adversely affecting the control circuitry of the OLED display screen. Further, the presence of the light absorption layer can, in some cases, help reduce cross-talk (i.e., light emitted from the sensor module that returns to the photodetector before ever reaching its target region). A well-designed light absorption layer can significantly improve the sensor/emitter/display system.

In one aspect, for example, the present disclosure describes a display screen that includes a carrier, OLED pixels disposed over the carrier, and control circuitry disposed over the carrier and coupled to the OLED pixels. The display screen also includes a light absorption layer disposed in a plane such that the carrier is on a first side of the plane, and the OLED pixels and control circuitry are on a second side of the plane.

In another aspect, the present disclosure describes an apparatus that includes an optical sensor module including a light source and a light detector, and an OLED display screen disposed over the optical sensor module. The sensor module may be in contact with the OLED display screen or may be separated by an air gap. The OLED display screen includes a carrier that is transmissive to light emitted by the light source, OLED pixels disposed over the carrier, and control circuitry disposed over the carrier and coupled to the OLED pixels. The OLED display screen also includes a light absorption layer disposed in a plane such that the carrier is on a first side of the plane, and the OLED pixels and control circuitry are on a second side of the plane. The light absorption layer has one or more openings to allow light produced by the light source of the optical sensor module to pass through the light absorption layer. The one or more openings in the absorption layer may be aligned with one or more openings in the OLED pixels and control circuitry.

Some implementations include one or more of the following features. For example, in some instances, the light absorption layer is composed of at least one metal. Specific examples of the material(s) for the light absorption layer include Mo, Cr, Au, Ag, Al, Cu, Ni, or Ti, combinations of the foregoing, and alloys of one or more of the foregoing. In some cases, the light absorption layer includes a stack of sub-layers, wherein an uppermost layer of the stack that is in a plane closest to the OLED pixels and the control circuitry is composed of a metal.

In some implementations, the light absorption layer is composed of a material that reflects no more than 20% of the light that is produced by the light source and that impinges on the light absorption layer. Further, in some cases, the light absorption layer is composed of a material that reflects no more than 5% of the light that is produced by the light source and that impinges on the light absorption layer. Yet further, in some instances, the light absorption layer is composed of a material that reflects no more than 1% of the light that is produced by the light source and that impinges on the light absorption layer.

In some implementations, the control circuitry includes thin film transistors (TFTs), each of which includes a region that is sensitive to infra-red light, and the light absorption layer is composed of material that absorbs infra-red light. Likewise, in some cases, the OLED pixels may include one or more layers that are highly reflective for infra-red light, and the light absorption layer is composed of material that absorbs infra-red light.

The display screen also can include a planarizing layer on the light absorption layer, wherein the planarizing layer is disposed on a side of the light absorption layer opposite that of the carrier.

The light absorption layer can include an opening to allow light originating at a carrier-side of the display screen to pass through the display screen. For example, the opening in the light absorption layer can be disposed so as to allow the infra-red light originating at the carrier-side of the display screen to pass through the display screen without significantly impinging on a light sensitive layer of any of the TFTs. In some instances, the opening in the light absorption layer is disposed so as to allow the infra-red light originating at the carrier-side of the display screen to pass through the display screen without significantly impinging on a highly reflective layer of any of the OLED pixels.

The OLED display screen can be integrated in a consumer electronics product with a wide range of optical sensor modules, including, for example, proximity sensors, ranging sensors such as time-of-flight sensors, ambient light sensors, 2D imaging sensors, and 3D imaging sensors.

Other aspects, features and advantages will be readily apparent from the following detailed description, the accompanying drawings, and the claims.

DETAILED DESCRIPTION

Figure 1:
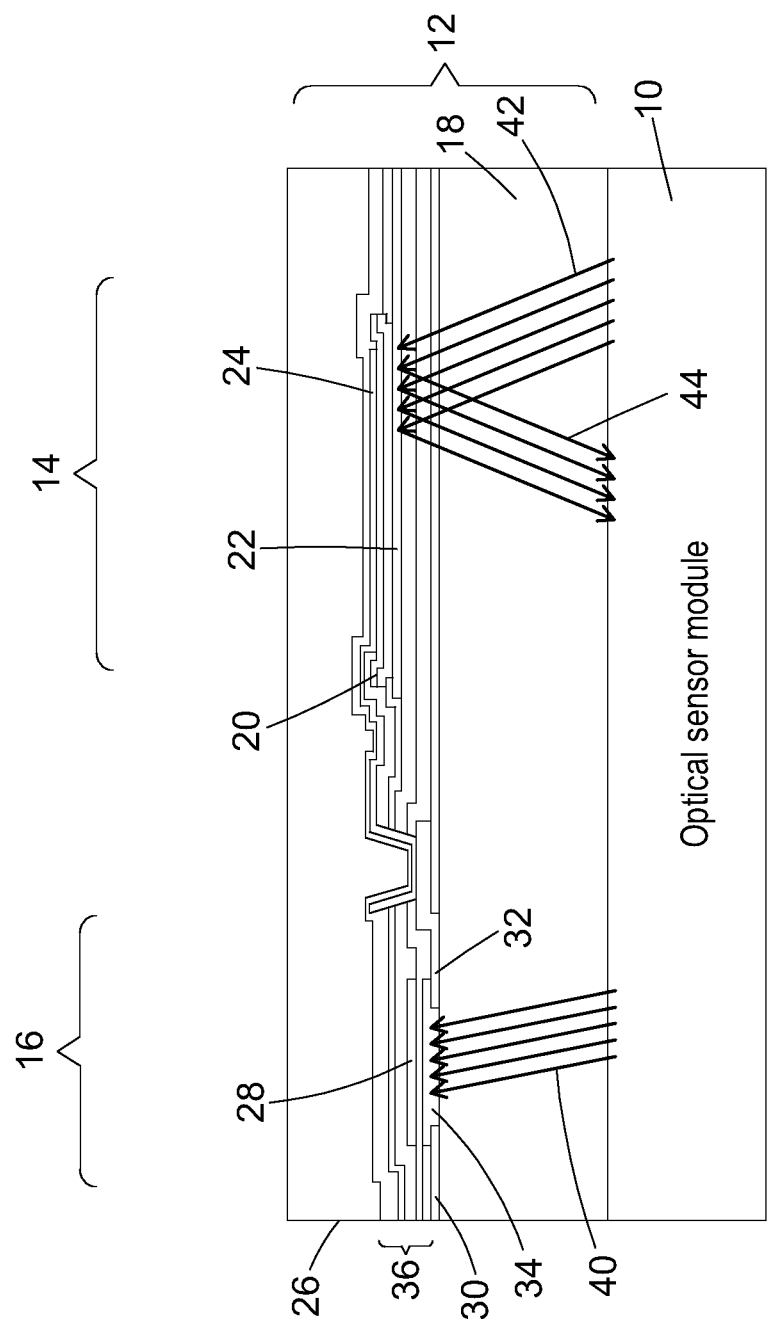
FIG. 1 illustrates a schematic example of an optical sensor module disposed behind an OLED display screen.

FIG. 1 illustrates an example of an optical sensor module 10 disposed behind an OLED display screen 12 of a smart phone or other portable computing device. The optical sensor module 10 typically includes one or more light emitting elements (e.g., VCSELs) operable to produce light having wavelength(s) in a particular part of the electromagnetic spectrum (e.g., infra-red). The light from the optical sensor module can be transmitted through the OLED display screen 12 and can exit the smart phone or other device. Some of the light may be reflected, for example, by an object outside the smart phone or other device. Some of the reflected light may return to the smart phone or other device and pass back through the OLED display screen 12 and be detected by one or more optical sensing elements (e.g., photodiodes) operable to detect light having the same wavelength(s) as the light produced by the light emitting element(s).

As further shown in FIG. 1, the OLED display screen 12 can include OLED pixels and control circuitry on, for example, a glass, polymer, silicate, or plastic carrier 18. The OLED pixels and control circuitry are between the carrier and the viewer in a typical product assembly. In a product assembly that includes a sensor module 10 as in FIG. 1, the carrier is between the sensor module and the OLED pixels. Each pixel can include multiple sub-pixels (e.g., red, green, blue), and the control circuitry can include thin film transistors (TFTs). Although FIG. 1 shows only a region with a single sub-pixel 14 and a single TFT 16, the OLED display screen 12 typically includes many pixels and associated TFTs. Each pixel can include multiple TFTs 16, which are operable for addressing pixels, loading frame data, storing frame data, and removing frame data.

Details of an example sub-pixel 14 and TFT 16 are discussed below. The details may differ, however, in other implementations.

In the example of FIG. 1, the sub-pixel 14 includes OLED material layers 20 disposed between a cathode layer 22 and an anode layer 24. The cathode layer can be composed, for example, of a conductive material such as metal (e.g., aluminum) or indium tin oxide (ITO). In the illustrated example, the anode 24 is composed of ITO, which is transparent to light. Light produced by the OLED pixels passes through a planarizing or encapsulating layer 26, which can protect the other layers, for example, from water and oxygen.

In the example of FIG. 1, the TFT 16 is shown as a top-gate that includes a source 30 and drain 32, and a metal gate electrode 28. The active region 34 between the source 30 and drain 32 (and below the gate 28) can be composed, for example, of amorphous silicon (α-Si) or amorphous indium gallium zinc oxide (α-IGZO)). Such materials can be sensitive to light (e.g., infra-red). The active region 34 is shielded from light on their top side by the metal gate electrode 28. Various passivation layers 36 (e.g., SiN and/or $SiO_2$) may be present as well.

FIG. 1 also illustrates various issues that can arise when an optical sensor module 10 is disposed behind (i.e., beneath) the OLED display screen 12. First, as there is no light shield below the TFT's light sensitive active region 34, illumination 40 from the optical sensor module 10 may impinge on the active region 34, which can reduce performance of the TFT 16, and may cause circuit leakage, malfunction, and/or display artifacts. Further, illumination 42 from the optical sensor module 10 may impinge on metal areas of the pixel (e.g., the cathode layer 22), and reflections 44 off the metal areas may result in "noise" or other signals that interfere with ideal operation of the sensor module.

Figure 2:
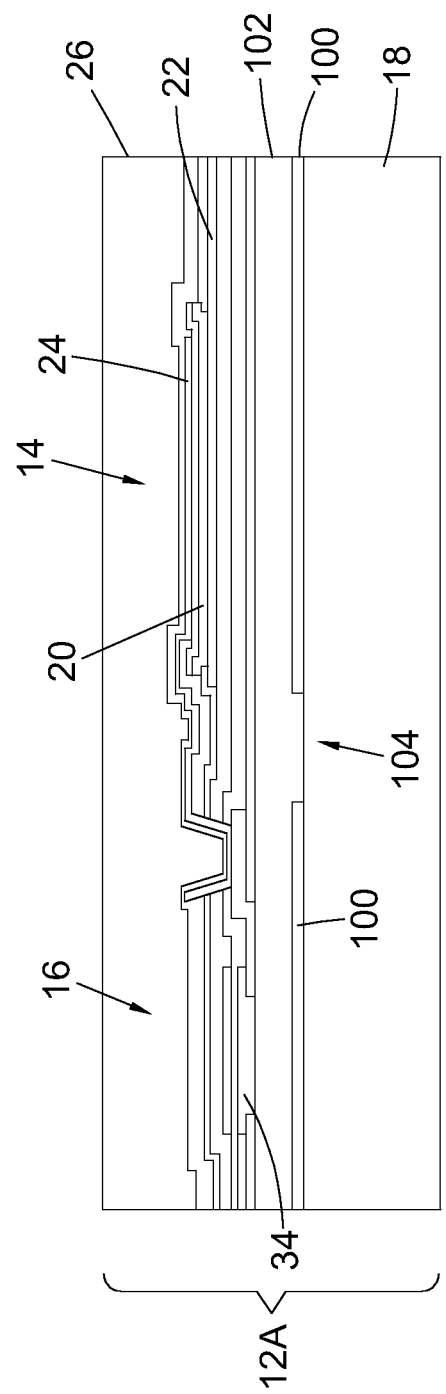
FIG. 2 illustrates an example of an OLED display screen that includes a light absorption layer.

As shown in FIG. 2, to obviate, or at least reduce, one or both of the foregoing issues, a light absorption layer 100 can be disposed on the carrier 18 for the OLED display screen 12A. In some implementations, the light absorption layer 100 can be provided on the surface of the carrier 18 prior to formation of the pixels and control circuitry. The light absorption layer 100 protects portions of the sub-pixels 14 and the TFTs 16 from the light produced by the sensor module's light emitter.

In some applications (e.g., proximity sensing and TOF sensing), the optical sensor module 10 may be operable to emit infra-red light (e.g., a wavelength of 940 nm; more generally, in the range of about 760 nm to 1,000 μm). For such applications, the light absorption layer 100 can be composed of one or more sub-layers that block and absorb most of the infra-red light impinging on the light absorption layer 100. Examples of metals that can be used for the light absorption layer 100 include aluminum (Al), an aluminum-copper (Al—Cu) alloy, molybdenum chromium (MoCr) or titanium (Ti), as well as others. In some instances, the light absorption layer 100 is a stack of different sub-layers, where at least the uppermost layer (i.e., the sub-layer closest to the pixels and TFTs) is composed of one of the foregoing materials. A further advantage that can be obtained in some implementations is that the metal top layer also can be used for routing electrical signals.

Preferably, the materials and thickness of the light absorption layer 100 should reflect no more than 20% of the impinging light. In some instances, it is desirable that the light absorption layer 100 reflect no more than 5% (or no more than 1%) of the impinging light from the light emitter in the sensor module 10. In the event that the optical sensor module 10 is operable to emit light at a wavelength different from infra-red, the light absorption layer 100 can be composed of a suitable material that absorbs the light such that no more than 20% (or 5% or 1% depending on the requirements of the application) of the impinging light from the sensor module 10 is reflected by the light absorption layer 100.

In some instances, a planarizing layer 102 is present on the light absorption layer 100. In some such cases, the light absorption layer 100 and the planarizing layer 102 are disposed between the carrier 18 and the OLED pixels and control circuitry (e.g., the TFTs 16). The planarizing layer 102 can provide a relatively flat surface on which the OLED pixels and control circuitry can be formed. In some instances, the planarizing layer 102 is provided by a spin-on-glass (SOG) technique and may be composed, for example, of silicates or siloxane.

Figure 3:
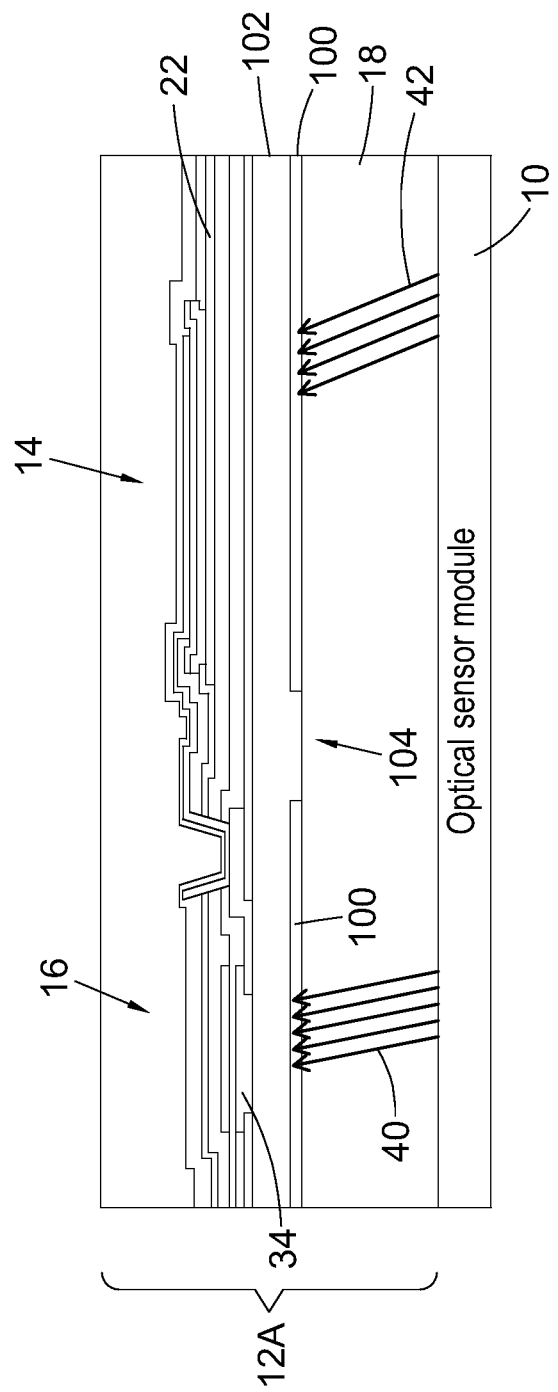
FIG. 3 illustrates potential advantages of the light absorption layer.

As illustrated in FIG. 3, the light absorption layer 100 can help prevent light emitted by the senor module 10 from directly impinging on light sensitive regions (e.g., the active region 34) of the TFTs 16. The light absorption layer 100 also can help prevent light from directly impinging on, and being reflected by, reflective regions of the pixels (e.g., a metal cathode layer 22). The addition of the light absorption layer 100 thus can be advantageous because it allows the light emitting element (e.g., VCSEL) in the sensor module 10 to be operated at a higher power and/or for a longer duration without adversely affecting the TFTs 16 and the OLED display screen 12A. Further, the presence of the light absorption layer 100 can help reduce cross-talk between the light emitting element (e.g., a VCSEL) and a proximity or other optical sensors in the sensor module 10. Thus, a well-designed light absorption layer 100 can make significant improvements in the performance of the sensor/emitter/display system.

As explained above, the light absorption layer 100 can be disposed so as intercept and absorb light emitted by the sensor module 10 that otherwise would impinge on the light sensitive regions (e.g., the active regions 34) of the TFTs 16 and/or that would impinge on (and be reflected by) reflective regions 22 of the pixels.

Figure 4:
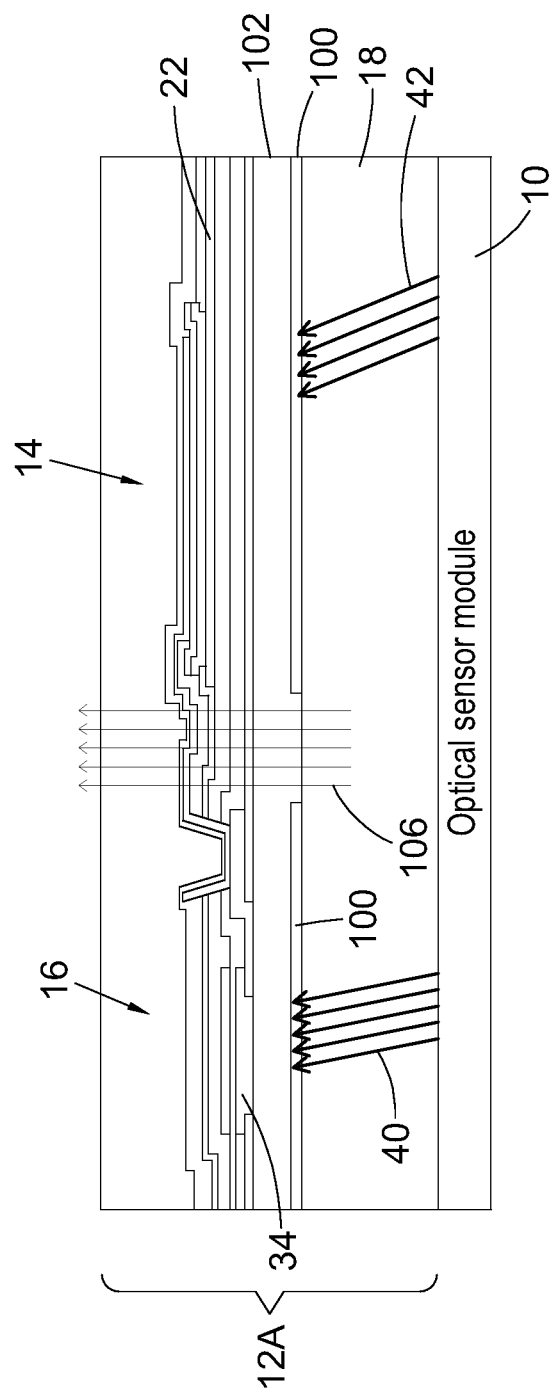
FIGS. 4 and 5 illustrate further details of the light absorption layer.
Figure 5:
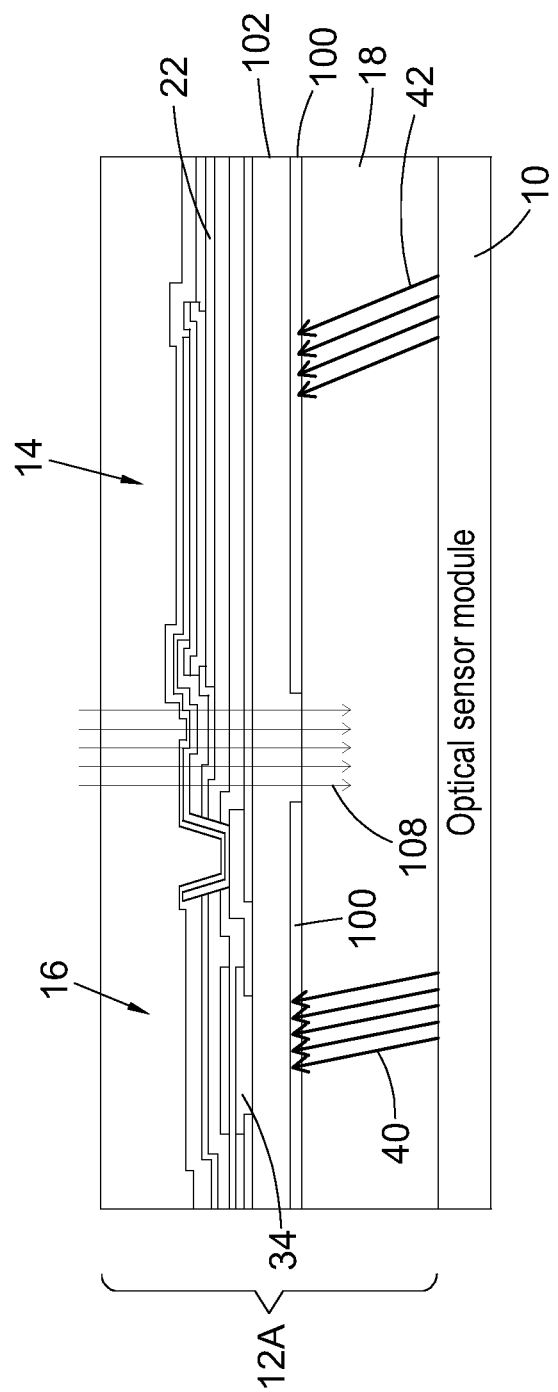

The light absorption layer 100 also has opening(s) 104. As shown in FIG. 4, the opening 104 allows light (e.g., infra-red) 106 emitted by the sensor module 10 to pass through the OLED display screen 12A. Likewise, as shown in FIG. 5, the opening 104 allows light (e.g., infra-red) 108 reflected by an object external to the smartphone (or other host device in which the OLED display screen 12A and the optical sensor module 10 are integrated) to pass through the OLED display screen 12A and to be detected by the sensor module 10. The light absorption layer 100 and opening(s) 104 can be patterned such that they allow light to pass through areas where the OLED display 12A also has openings in the control circuitry and other layers. In this way, a well-designed light absorption layer 100 will not significantly reduce the efficiency of the sensor/emitter/display system.

Figure 6:
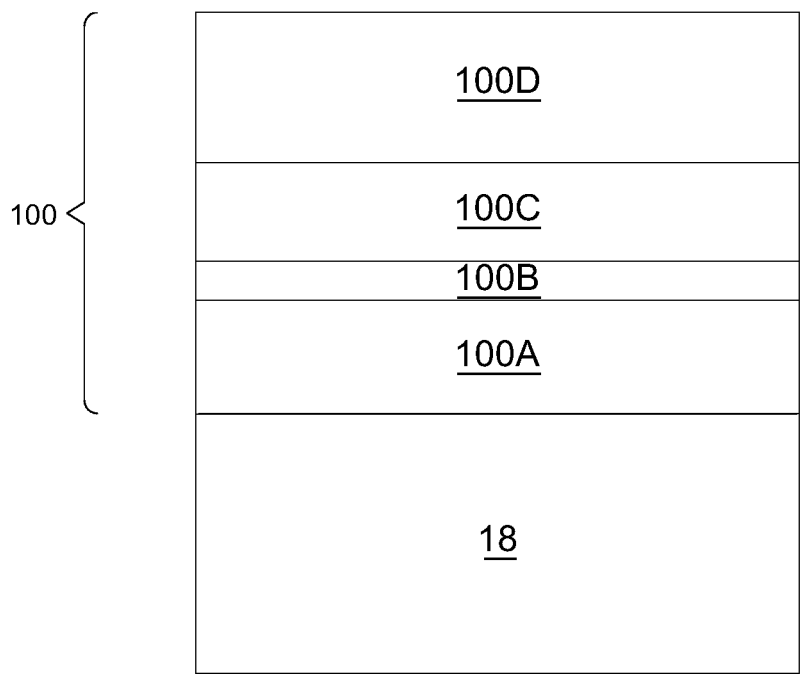
FIG. 6 illustrates details of the light absorption layer for some implementations.

FIG. 6 illustrates a particular example of the light absorption layer 100. In the illustrated example, the light absorption layer 100 includes four sub-layers 100A, 100B, 100C, 100D disposed one on the other in a stack on the carrier 18. The first sub-layer 100A is a dielectric passivation/adhesion layer and may be needed when the topmost surface of the carrier 18 is not suitable for deposition of the next sub-layer 100B (e.g., because there needs to be additional electrical insulation or improved adhesion). The first sub-layer 100A can be composed, for example, of $SiO_2$ and can have a thickness, for example, of 100-200 nm (e.g., 140 nm). In some instances, the first sub-layer 100A may be omitted. The next sub-layer 100B serves as a partial mirror layer. It is thin and optimized to balance reflection, transmission, and absorption. Examples of materials for the second sub-layer 100B include metals such as Mo, Cr, Au, Ag, Al, Cu, Ni, Ti, and various alloys these metals. The thickness of the sub-layer 100B in some instances is in the range of 5-20 nm (e.g., about 9 nm). The next sub-layer 100C is a dielectric layer such as $SiO_2$ or SiN and separates the partial mirror layer 100B from the top sub-layer 100D, which serves as a full mirror layer. The thickness of the sub-layer 100C in some instances is in the range of 100-200 nm (e.g., 145 nm). The top sub-layer 100D serves as a full mirror layer and should be reflective and opaque. Examples of materials for the top sub-layer 100D include metals, particularly those used in display routing such as Au, Ag, Al, Cu, Ni, Ti, and various alloys of these metals. In some instances, the sub-layer 100D is thick enough for routing (e.g., at least 80 nm). The foregoing details may differ in other implementations.

A well-designed light absorption layer of the style of FIG. 6 will, via optimized absorption and destructive interference, significantly reduce the amount of emitted sensor module light that is reflected back toward the sensor. The thicknesses of sub-layers 100A, 100B, 100C, 100D can be optimized based on the wavelength of the light, the angular distribution of the light, and the material properties (e.g., indices of refraction and absorption coefficients) of the materials used in fabrication. In other implementations, bulk absorption may be used without destructive interference playing a role.

In some implementations, fabrication of the OLED display screen 12A includes providing the carrier 18 and then forming the light absorption layer 100 on the carrier 18, forming the planarizing layer 102 on the light absorption layer 100, and subsequently forming the pixels and pixel control circuity over the planarizing layer 102. In other implementations, the fabrication process can be reversed such that the pixels and pixel control circuity are formed on a substrate, and the light absorption layer subsequently is formed over the pixels and pixel control circuity, followed by formation of a conformal or planarizing layer that serves as the carrier layer 18 for the OLED display screen when assembled in a product. An example is described in the following paragraph in connection with FIGS. 7A and 7B.

Figure 7B:
FIGS. 7A and 7B illustrate another implementation of the OLED display screen.
Figure 7A:
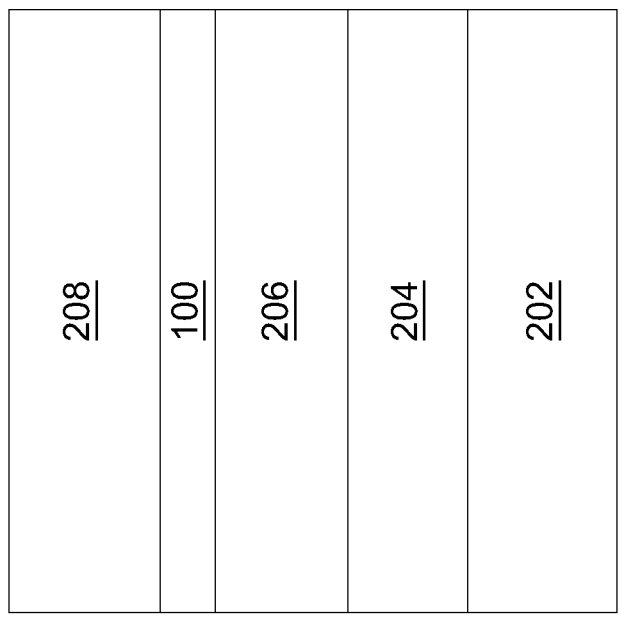

As shown in FIG. 7A, the OLED pixels and pixel control circuitry (e.g., TFTs) 204 are formed on a substrate 202. In some cases, a conformal or planarizing buffer layer 206 is formed over the pixels and pixel control circuitry 204. Next, a light absorption layer 100 is provided. The light absorption layer 100 can be composed of materials and arranged as described above. In some instances, the buffer layer 206 (if present) may form part of the light absorption layer 100. Next, a conformal or planarizing encapsulation layer 208 is formed on the light absorption layer(s) 100. The layers of FIG. 7A form an OLED display screen stack 12B, which can be flipped over and assembled into a product with a sensor module 10, as shown in FIG. 7B. Sensor module 10 may be in contact with the screen stack 12B or may be separated by an air gap. In this manner, the conformal or planarizing encapsulation layer 208 serves as a carrier for the other layers of the OLED display screen 12B, including the light absorption layer 100, the pixels and pixel control circuitry 204, and the conformal or planarizing encapsulation layer 208.

Depending on the implementation, the optical sensor module 10 can be configured for proximity sensing, TOF sensing or other types of optical sensing techniques. The light produced by, and sensed by the optical sensor module 10 may, in some instances, be structured light. The light emitting element(s) (e.g., VCSEL(s)) and the light sensing element(s) (e.g., photodiode(s)) in the sensor module 10 may be, but need not be, contained in the same package. In some implementations, the light emitting and light sensing elements are implemented as semiconductor dies mounted on a printed circuit board (PCB). The PCB, in turn, can be connected electrically to other components within a host device (e.g., a smartphone).

The sensor module can be coupled to control and processing circuitry (e.g., an electronic control unit), which can be implemented, for example, as one or more integrated circuits in one or more semiconductor chips with appropriate digital logic and/or other hardware components (e.g., read-out registers; amplifiers; analog-to-digital converters; clock drivers; timing logic; signal processing circuitry; and/or a microprocessor). The control and processing circuitry, and associated memory, may reside in the same semiconductor chip as the light receiver or in one or more other semiconductor chips. In some instances, the control and processing circuitry may be external to the optical sensor module; for example, the control and processing circuitry can be integrated into a processor for the smartphone or other host device in which the module is disposed.

The design of smart phones and other portable computing devices referenced in this disclosure can include one or more processors, one or more memories (e.g. RAM), storage (e.g., a disk or flash memory), a user interface (which may include, e.g., a keypad, a TFT LCD or OLED display screen, touch or other gesture sensors, a camera or other optical sensor, a compass sensor, a 3D magnetometer, a 3-axis accelerometer, a 3-axis gyroscope, one or more microphones, etc., together with software instructions for providing a graphical user interface), interconnections between these elements (e.g., buses), and an interface for communicating with other devices (which may be wireless, such as GSM, 3G, 4G, CDMA, WiFi, WiMax, Zigbee or Bluetooth, and/or wired, such as through an Ethernet local area network, a T-1 internet connection, etc.).

Figure 8:
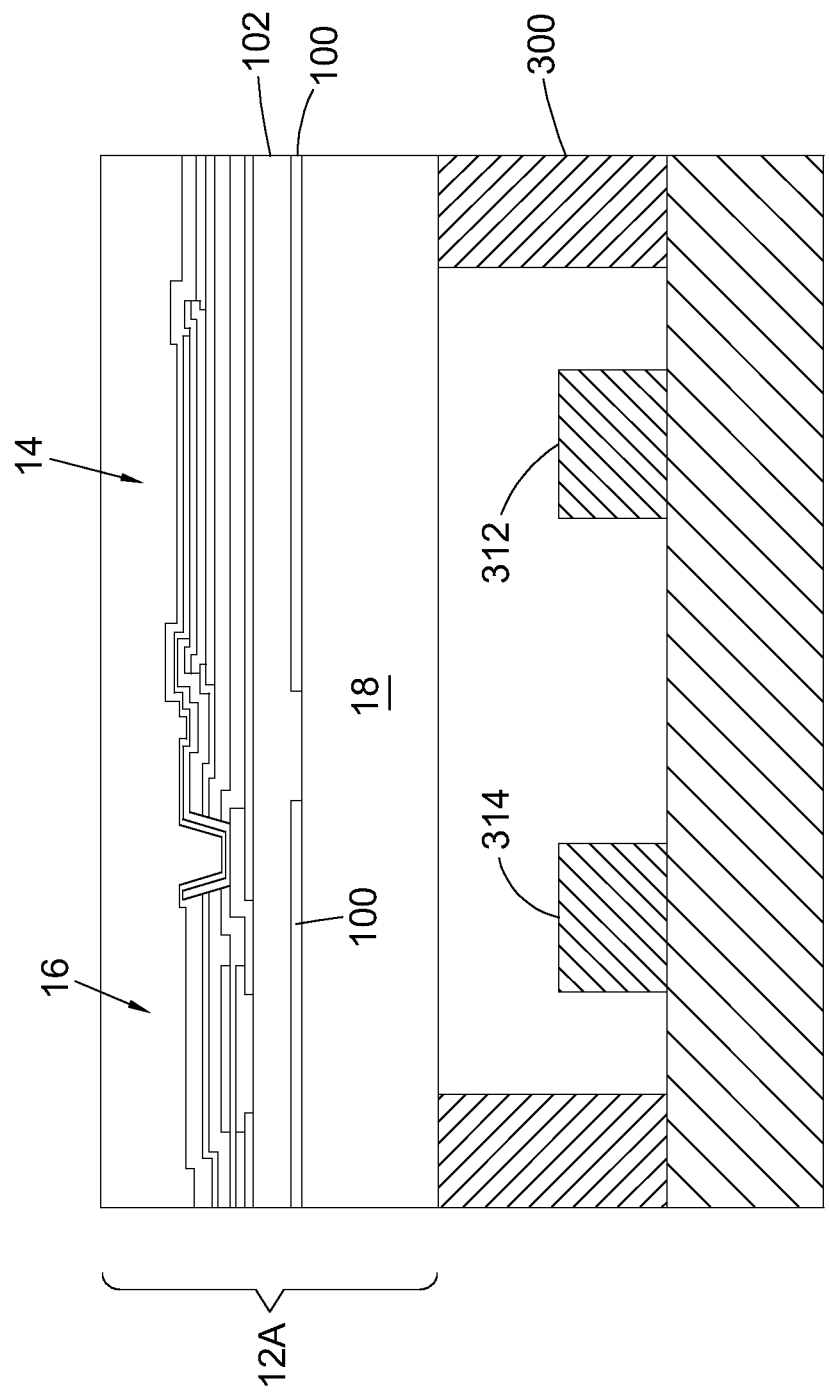
FIG. 8 illustrates further details of an example of an optical sensor module disposed behind the OLED display screen of FIG. 2.

FIG. 8 illustrates a specific example of an optical sensor module 300 disposed behind the OLED display screen 12A of a smartphone. In this case, the module 300 is a proximity sensor module that includes a light source 312 operable to produce light source, and a photodetector 314 operable to sense light of a wavelength (e.g., infra-red (IR), near IR, visible or ultraviolet (UV)) produced by the light source 312. The light source 312 can be, for example, a VCSEL, an LED, an OLED or a laser chip. The photodetector 314 can be, for example, a photodiode. The light source 312 and photodetector 314 can be implemented, for example, as integrated circuit semiconductor dies. In some cases, the module includes passive optical components to redirect light by refraction and/or diffraction and/or reflection (e.g., a lens, a prism, a mirror). The light source 312 is arranged to produce light that is emitted through the OLED display screen 12A toward a target outside the smartphone or other host device. Some of the light emitted from the host device may be reflected by the target back through the OLED display screen 12A and may be sensed by the photodetector 314. The detected signals then can be processed by the host device to determine whether an object is in close proximity to the device and, if so, to take some specified action (e.g., reducing the brightness of the OLED display screen). In some implementations, the relative sizes/thicknesses and other details of the display screen, pixels and pixel control circuitry, sensor module, light source, and photodetector may differ from that shown in FIG. 7. In general, however, the features of a partially transmissive display screen, a sensor module, and a light absorption layer disposed between certain areas of the display screen and the sensor module, will be present.

As mentioned above, in other instances, the optical sensor module 10 can be configured for TOF or other types of optical sensing.

In addition to smartphones, the present techniques can be integrated for use with other types of electronic devices with displays such as tablets, televisions, wearable devices, personal digital assistants (PDAs), robots, home assistants, and personal computers.

Other implementations are within the scope of the claims.

The invention claimed is:

1. A display screen comprising: a carrier; organic light emitting diode (OLED) pixels disposed over the carrier; control circuitry disposed over the carrier and coupled to the OLED pixels; a light absorption layer disposed in a plane such that the carrier is on a first side of the plane, and the OLED pixels and control circuitry are on a second side of the plane, wherein the light absorption layer includes a stack of at least three sub-layers including an uppermost layer, a first sub-layer, and a second sub-layer, and wherein the uppermost layer is in a plane closest to the OLED pixels and the control circuitry is composed of a metal, the first sub-layer is a dielectric layer, and the second sub-layer is a partial mirror layer that is separated from the uppermost layer by at least the dielectric layer.

2. The display screen of claim 1 wherein the light absorption layer is composed of at least one metal comprising one or more of Mo, Cr, Au, Ag, Al, Cu, Ni, or Ti.

3. The display screen of claim 1 further including a planarizing layer on the light absorption layer, wherein the planarizing layer is disposed on a side of the light absorption layer opposite that of the carrier.

4. The display screen of claim 1 wherein the light absorption layer is composed of a material that absorbs infra-red light.

5. The display screen of claim 1 wherein the control circuitry includes thin film transistors (TFTs), each of which includes a region that is sensitive to infra-red light.

6. The display screen of claim 5, wherein the light absorption layer has at least one opening to allow light originating at a carrier-side of the display screen to pass through the display screen, and wherein the at least one opening in the light absorption layer is disposed so as to allow the infra-red light originating at the carrier-side of the display screen to pass through the display screen without impinging on a light sensitive layer of any of the TFTs.

7. The display screen of claim 1 wherein each of the OLED pixels includes at least one layer that is highly reflective for infra-red light.

8. The display screen of claim 7, wherein the light absorption layer has at least one opening to allow light originating at a carrier-side of the display screen to pass through the display screen, and wherein the at least one opening in the light absorption layer is disposed so as to allow the infra-red light originating at the carrier-side of the display screen to pass through the display screen without impinging on a highly reflective layer of any of the OLED pixels.

9. The display screen of claim 1 wherein the light absorption layer has at least one opening to allow light originating at a carrier-side of the display screen to pass through the display screen.

10. An apparatus comprising: an optical sensor module including a light source and a light detector; an organic light emitting diode (OLED) display screen disposed over the optical sensor module, wherein the OLED display screen comprises: a carrier that is transmissive to light emitted by the light source; OLED pixels disposed over the carrier; control circuitry disposed over the carrier and coupled to the OLED pixels; a light absorption layer disposed in a plane such that the carrier is on a first side of the plane, and the OLED pixels and control circuitry are on a second side of the plane, the light absorption layer having at least one opening to allow light produced by the light source of the optical sensor module to pass through the display screen, wherein the light absorption layer includes a stack of at least three sub-layers including an uppermost layer, a first sub-layer, and a second sub-layer, and wherein the uppermost layer is in a plane closest to the OLED pixels and the control circuitry is composed of a metal, the first sub-layer is a dielectric layer, and the second sub-layer is a partial mirror layer that is separated from the uppermost layer by at least the dielectric layer.

11. The apparatus of claim 10, wherein the light absorption layer is composed of one of a material that reflects no more than 20% of the light that is produced by the light source and that impinges on the light absorption layer, a material that reflects no more than 5% of the light that is produced by the light source and that impinges on the light absorption layer, or a material that reflects no more than 1% of the light that is produced by the light source and that impinges on the light absorption layer.

12. The apparatus of claim 10 wherein the light absorption layer is composed of at least one metal comprising one or more of Mo, Cr, Au, Ag, Al, Cu, Ni, or Ti.

13. The apparatus of claim 10 wherein the OLED display screen further includes a planarizing layer on the light absorption layer, wherein the planarizing layer is disposed on a side of the light absorption layer opposite that of the carrier.

14. The apparatus of claim 10 wherein the light source is operable to produce infra-red light.

15. The apparatus of claim 10 wherein the control circuitry includes thin film transistors (TFTs), each of which includes a region that is sensitive to infra-red light.

16. The apparatus of claim 15 wherein the at least one opening in the light absorption layer is disposed so as to one of allow the light produced by the light source to pass through the display screen without impinging on a light sensitive layer of any of the TFTs or allow the light produced by the light source to pass through the display screen without impinging on a highly reflective layer of any of the OLED pixels.

17. The apparatus of claim 10 wherein each of the OLED pixels includes at least one layer that is highly reflective for infra-red light.

18. The apparatus of claim 10 wherein the optical sensor module is operable for proximity sensing, and/or the optical sensor module is operable for time-of-flight sensing.

* * * * *